(12) United States Patent
Oka et al.

(10) Patent No.: US 7,567,128 B2
(45) Date of Patent: Jul. 28, 2009

(54) POWER AMPLIFIER SUPPRESSING RADIATION OF SECOND HARMONIC OVER WIDE FREQUENCY BAND

(75) Inventors: Tohru Oka, Nara (JP); Masatomo Hasegawa, Nara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 105 days.

(21) Appl. No.: 11/797,309

(22) Filed: May 2, 2007

(65) Prior Publication Data

US 2007/0296505 A1   Dec. 27, 2007

(30) Foreign Application Priority Data

May 11, 2006   (JP)   ............................. 2006-132499

(51) Int. Cl.
*H03F 3/04* (2006.01)
(52) U.S. Cl. ....................................... 330/302; 330/306
(58) Field of Classification Search ................... 330/302
See application file for complete search history.

(56) References Cited

U.S. PATENT DOCUMENTS

| | | | |
|---|---|---|---|
| 4,433,315 A | * | 2/1984 | Vandegraaf ................. 333/174 |
| 5,095,285 A | * | 3/1992 | Khatibzadeh ............... 330/306 |
| 5,151,672 A | | 9/1992 | Noto et al. |
| 5,347,299 A | | 9/1994 | Entz et al. |
| 6,177,841 B1 | | 1/2001 | Ohta et al. |
| 2002/0097089 A1 | | 7/2002 | Takada |

FOREIGN PATENT DOCUMENTS

| | | |
|---|---|---|
| JP | 62-111 A | 1/1987 |
| JP | 3-185908 A | 8/1991 |
| JP | 7-22872 A | 1/1995 |
| JP | 9-18255 A | 1/1997 |
| JP | 9-46148 A | 2/1997 |
| JP | 10-65465 A | 3/1998 |
| JP | 2000-106510 A | 4/2000 |
| JP | 2002-223129 A | 8/2002 |

* cited by examiner

*Primary Examiner*—Robert Pascal
*Assistant Examiner*—Khiem D Nguyen
(74) *Attorney, Agent, or Firm*—Birch, Stewart, Kolasch & Birch, LLP

(57) ABSTRACT

Two trap circuits different in frequencies at which short-circuit is established are provided in an output matching circuit. Out of the two trap circuits, the trap circuit higher in frequency at which short-circuit is established is arranged closer to a power amplification element. Thus, a frequency band higher than a frequency twice as high as a central frequency of a transmission frequency band is trapped, impedance of the output matching circuit with respect to the frequency in a frequency band twice as high as the transmission frequency band on the side of an output end of the power amplification element is kept in a state close to short-circuit, and the trap circuit lower in frequency at which short-circuit is established traps the frequency band lower than the frequency twice as high as the central frequency of the transmission frequency band.

4 Claims, 6 Drawing Sheets

POWER AMPLIFIER SUPPRESSING RADIATION OF SECOND HARMONIC OVER WIDE FREQUENCY BAND

This nonprovisional application is based on Japanese Patent Application No. 2006-132499 filed with the Japan Patent Office on May 11, 2006, the entire contents of which are hereby incorporated by reference.

FIELD OF THE INVENTION

The present invention relates to a power amplifier used for amplification of high-frequency electric power in a microwave band or the like used in radio communication equipment represented by a portable telephone or wireless LAN, and more particularly to a power amplifier used in applications for amplifying a signal in a transmission frequency band across a wide band.

DESCRIPTION OF THE BACKGROUND ART

For a power amplifier for transmission used in radio communication equipment such as a portable telephone or wireless LAN, such a scheme that a trap circuit short-circuiting impedance with respect to a frequency twice as high as a frequency used for transmission of a signal (hereinafter, referred to as a transmission frequency) is provided within an output matching circuit has widely been employed.

By providing a trap circuit within the output matching circuit, radiation from the power amplifier, of second harmonic resulting from a non-linear operation of a power amplification element constituting the power amplifier can be suppressed. In addition, by arranging the trap circuit such that impedance of the output matching circuit with respect to the frequency twice as high as the transmission frequency on the side of the power amplification element is short-circuited, the power amplifier can operate with high efficiency.

FIG. 7 illustrates an exemplary conventional power amplifier (hereinafter, referred to as the first conventional example). Here, a simplified version of the figure in Japanese Patent Laying-Open No. 07-022872 is shown, illustrating a configuration of main portions in the power amplifier where a trap circuit implemented by an open stub short-circuits impedance with respect to a frequency twice as high as a transmission frequency.

Referring to FIG. 7, the conventional power amplifier includes an input terminal 101 of the power amplifier, an input matching circuit 102, a power amplification element 103, an input-side bias circuit 104 of the power amplification element, an output-side power supply circuit 105 of the power amplification element, a bias supply terminal 106 of input-side bias circuit 104, a power supply terminal 107 of output-side power supply circuit 105, an output matching circuit 108, and an output terminal 109 of the power amplifier.

Input matching circuit 102 receives a signal from input terminal 101 and outputs the signal to the base of power amplification element 103 implemented by a GaAs heterojunction bipolar transistor. In addition, input-side bias circuit 104 is provided between bias supply terminal 106 and the base of power amplification element 103. Power amplification element 103 has the emitter electrically coupled to a ground GND and the base coupled to an output node of input matching circuit 102 and input-side bias circuit 104. Output-side power supply circuit 105 is provided between the collector of power amplification element 103 and power supply terminal 107.

Output matching circuit 108 is constituted of a microstrip line 110 and a matching circuit 111, and an open stub 112 serving as the trap circuit is provided at a connection point of the collector of power amplification element 103 and microstrip line 110.

Open stub 112 has a length of $\lambda_{g2}/4$ ($\lambda_{g2}$ represents a propagation wavelength of second harmonic), and serves as the trap circuit for short-circuiting impedance of output matching circuit 108 with respect to the frequency twice as high as the transmission frequency on the side of an output end of power amplification element 103. Matching circuit 11 is provided between microstrip line 110 and output terminal 109.

The second harmonic generated from power amplification element 103 is reflected under the influence of open stub 112 serving as the trap circuit, and consequently, the power amplifier operates with high efficiency and the second harmonic output from output terminal 109 of the power amplifier is suppressed.

FIG. 8 illustrates another exemplary conventional power amplifier (hereinafter, referred to as the second conventional example). Here, a simplified version of the figure in Japanese Patent Laying-Open No. 09-046148 is shown, illustrating a configuration of main portions in the power amplifier where the trap circuit in which a series resonant circuit including an inductor L and a capacitor C is connected to ground GND short-circuits impedance with respect to the frequency twice as high as the transmission frequency.

Referring to FIG. 8, another conventional power amplifier is different from the power amplifier in FIG. 7 in that output matching circuit 108 is replaced with an output matching circuit 108P.

Output matching circuit 108P includes capacitors 113 to 117, inductors 118 and 119, and a microstrip line 120.

A series resonant circuit consisting of capacitor 115 and inductor 118 is provided between ground GND and microstrip line 120, thus serving as a trap circuit 121. A series resonant circuit consisting of capacitor 116 and inductor 119 is provided between ground GND and microstrip line 120, thus serving as a trap circuit 122. A resonant frequency of the series resonant circuits is twice as high as the transmission frequency, and trap circuits 121 and 122 serve as the trap circuits for the twice higher frequency.

Here, two trap circuits are provided, whereby an effect thereof is enhanced. Microstrip line 120 has a length of $\lambda_g/4$ ($\lambda_g$ represents a propagation wavelength of the transmission frequency), and short-circuits impedance of the output matching circuit, with respect to the frequency twice as high as the transmission frequency on the side of the output end of power amplification element 103. The second harmonic generated from the power amplification element is reflected under the influence of these series resonant circuits serving as the trap circuits, and consequently, the power amplifier operates with high efficiency and the second harmonic output from output terminal 109 of the power amplifier is suppressed.

Meanwhile, in radio communication systems in recent years, depending on countries or regions, frequencies allocated to the systems slightly vary even though the same communication scheme is employed. For example, in the case of a wireless LAN system in a 5 GHz band, a frequency around 5.2 GHz is used in Japan and the like, while a frequency around 5.8 GHz is used in North America and the like. In order to address such a situation, in the power amplifier for transmission used in the recent radio communication systems, a single power amplifier is required to operate over a wide frequency band.

The conventional techniques, however, do not address suppression of the second harmonic over a wide frequency band and short-circuiting of impedance of the output matching circuit with respect to the frequency twice as high as the transmission frequency on the side of the power amplification element.

SUMMARY OF THE INVENTION

The present invention was made to solve the above-described problems. An object of the present invention is to provide a power amplifier capable of suppressing radiation of second harmonic over a wide frequency band and operating with high efficiency.

In addition, another object of the present invention is to provide a power amplifier capable of suppressing radiation of second harmonic and third harmonic over a wide frequency band and operating with high efficiency.

In order to achieve the object of the present invention, a power amplifier according to the present invention includes a power amplification element and an output matching circuit connected to an output end of the power amplification element. The output matching circuit includes a plurality of trap circuits establishing short-circuit at frequencies higher than a desired transmission frequency band and at frequencies different from each other. Out of at least two trap circuits among the plurality of trap circuits, the trap circuit higher in frequency at which short-circuit is established is arranged closer to the output end of the power amplification element than the trap circuit lower in frequency at which short-circuit is established. Impedance of the output matching circuit on the side of the output end of the power amplification element is set such that impedance is short-circuited with respect to at least one frequency in a frequency band twice as high as the desired transmission frequency band.

Preferably, a phase of the impedance with respect to the frequency in the frequency band twice as high as the desired transmission frequency band, of the output matching circuit on the side of the output end of the power amplification element, is set in a range from 173 degrees to 193 degrees in Smith chart.

Preferably, the frequency at which the trap circuit establishes short-circuit, the trap circuit being lowest in frequency at which short-circuit is established among the trap circuits, is set to at least 1.4 times as high as a frequency highest in the desired transmission frequency band.

Preferably, the frequency at which the trap circuit establishes short-circuit, the trap circuit being arranged closer to the output end of the power amplification element, is set to a frequency in a frequency band three times as high as the desired transmission frequency band.

Preferably the trap circuit is implemented by a series resonant circuit including at least an inductor and a capacitor.

According to the power amplifier of the present invention, the circuit that brings to a state close to short-circuit, the impedance with respect to the frequency twice as high as the transmission frequency, of the output matching circuit on the side of the power amplification element, and traps the second harmonic over wide frequencies is provided. Therefore, the power amplifier capable of suppressing radiation of the second harmonic over a wide band and operating with high efficiency can be provided.

In addition, by employing the circuit trapping the third harmonic as the trap circuit, the power amplifier capable of suppressing radiation of the second harmonic and the third harmonic over a wide band and operating with high efficiency can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
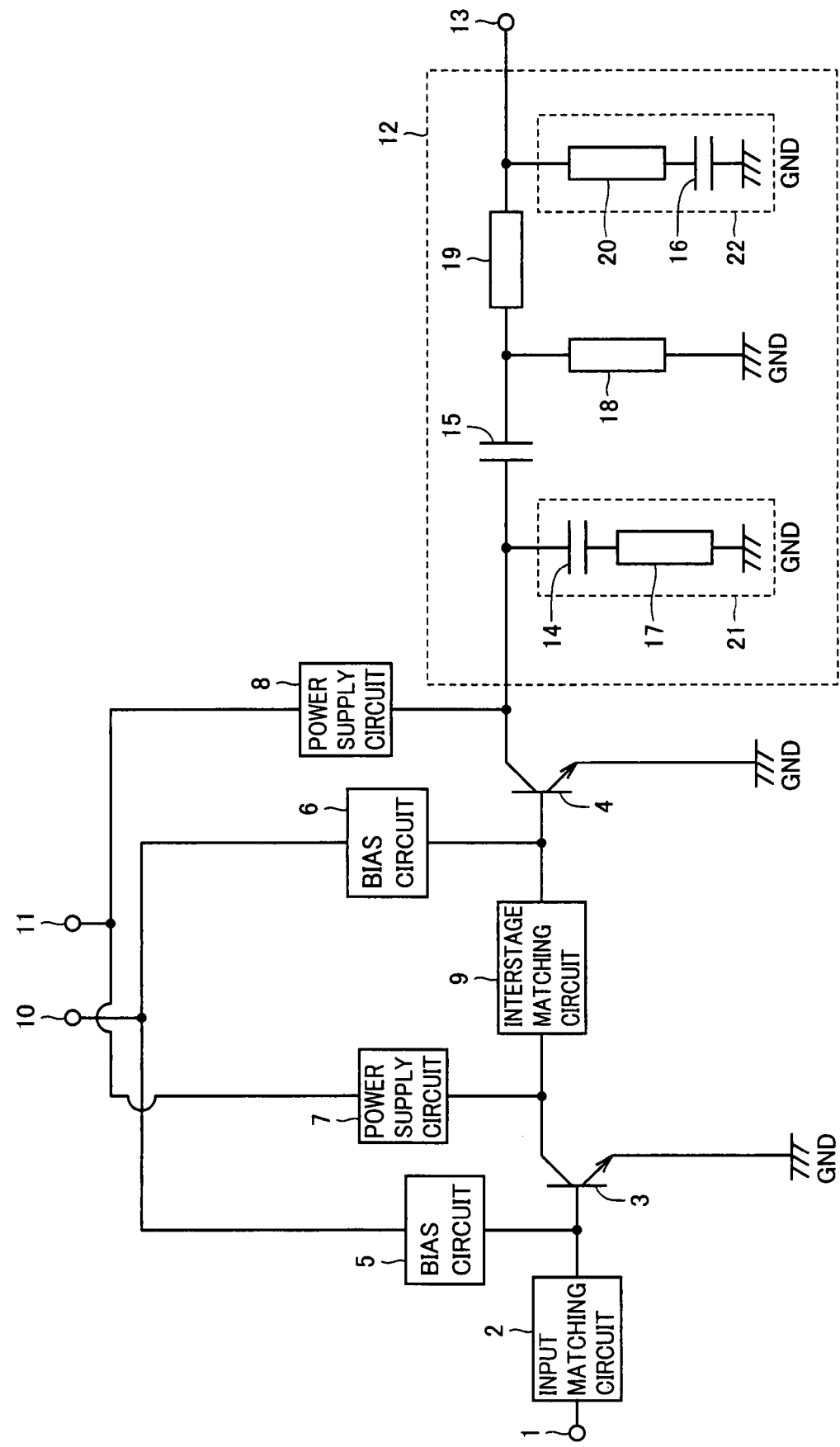
FIG. 1 illustrates a power amplifier according to a first embodiment of the present invention.

An embodiment of the present invention will be described hereinafter in detail with reference to the drawings. It is noted that the same or corresponding elements have the same reference characters allotted and detailed description thereof will not be repeated.

First Embodiment

A power amplifier according to a first embodiment of the present invention will be described with reference to FIG. 1. Here, a configuration of the power amplifier using two power amplification element stages and adapted to a wide band, i.e., a transmission frequency band from 4.8 to 6.0 GHz, will be described.

The power amplifier according to the first embodiment of the present invention includes an input terminal 1 of the power amplifier, an input Matching circuit 2, power amplification elements 3 and 4, input-side bias circuits 5 and 6 provided in correspondence with power amplification elements 3 and 4 respectively, output-side power supply circuits 7 and 8 provided in correspondence with power amplification elements 3 and 4 respectively, an interstage matching circuit 9, a bias supply terminal 10 of input-side bias circuits 5 and 6, a power supply terminal 11 of output-side power supply circuits 7 and 8, an output matching circuit 12, and an output terminal 13 of the power amplifier.

The power amplifier is formed on a GaAs semiconductor substrate, and power amplification elements 3 and 4 are implemented by GaAs hetero-junction bipolar transistors.

Output matching circuit 12 includes capacitors (C) 14 to 16 and inductors (L) 17 to 20. Capacitors 14 to 16 in output matching circuit 12 are implemented by MIM (Metal-Insulator-Metal) capacitors formed on the GaAs semiconductor substrate. Meanwhile, inductors 17 to 20 in output matching circuit 12 are implemented by microstrip lines and spiral inductors formed on the GaAs semiconductor substrate.

Input matching circuit 2 is provided between input terminal 1 and the base of power amplification element 3. In addition, bias circuit 5 is provided between bias supply terminal 10 and the base of power amplification element 3. Power amplification element 3 has the emitter electrically coupled to ground GND. Power supply circuit 7 is electrically coupled to power supply terminal 11 and the collector of power amplification element 3. Interstage matching circuit 9 is provided between the collector of power amplification element 3 and the base of power amplification element 4. Bias circuit 6 is provided between bias supply terminal 10 and the base of power amplification element 4. Power amplification element 4 has the emitter electrically coupled to ground GND. Power supply circuit 8 is provided between power supply terminal 111 and the collector of power amplification element 4.

Power amplification element 4 has the collector coupled to output matching circuit 12. In output matching circuit 12, one electrode of capacitor 15 is coupled to the collector of power amplification element 4 and the other electrode is coupled to inductor 19. Inductor 19 has one terminal coupled to the other electrode of capacitor 15 and the other terminal coupled to output terminal 13. A series resonant circuit consisting of capacitor 14 and inductor 17 is provided between ground GND and one terminal of capacitor 15, thus serving as a trap circuit 21. In addition, a series resonant circuit consisting of capacitor 16 and inductor 20 is provided between ground GND and the other terminal of inductor 19, thus serving as a trap circuit 22. Inductor 18 is provided between the other electrode of capacitor 15 and ground GND.

As described above, trap circuits 21 and 22 are implemented in such a manner that the series resonant circuits including a set of capacitor 14 and inductor 17 and a set of capacitor 16 and inductor 20 are connected to the grounds, respectively, and thus the trap circuits are made smaller in size.

A resonant frequency of trap circuit 21 arranged closer to power amplification element 4 is set to 11.4 GHz such that trap circuit 21 serves as the trap circuit for a frequency band higher than the frequency twice as high as a central frequency of the transmission frequency band and impedance of output matching circuit 12 with respect to the frequency in the frequency band twice as high as the transmission frequency band on the side of the output end of power amplification element 4 is substantially short-circuited. Here, "substantially short-circuited" refers to such a state that the absolute value of the impedance is in a range from at least 0.96 to at most 1.00 and a phase thereof is in a range from 178 degrees to 182 degrees in Smith chart. As to the resonant frequency and arrangement of trap circuit 21 arranged closer to power amplification element 4, it has been confirmed through calculation by an electrical circuit simulator that, if the resonant frequency and the arrangement are such that the phase of the impedance with respect to the frequency in the frequency band twice as high as the frequency in the transmission frequency band, of output matching circuit 12 on the side of the output end of power amplification element 4 is in a range from 173 degrees to 193 degrees in Smith chart, the impedance with respect to the frequency band twice higher can be brought to a state close to short-circuit and a similar effect can be obtained.

On the other hand, the resonant frequency of trap circuit 22 arranged farther from power amplification element 4 is set to 8.4 GHz such that trap circuit 22 serves as the trap circuit for the frequency band lower than the frequency twice as high as the central frequency of the transmission frequency band. As to a resonant frequency circuit of the trap circuit arranged farther from the power amplification element as the trap circuit lowest in frequency at which short-circuit is established, it has been confirmed through calculation by the electrical circuit simulator that, if the resonant frequency at least 1.4 times as high as the frequency highest in the transmission frequency is set, the transmission frequency band is hardly affected, which is desirable.

Taking into account the fact that these series resonant circuits serve as capacitive components with respect to the frequency in the transmission frequency band, each value of inductor 17 and capacitor 14 as well as inductor 20 and capacitor 16 in trap circuits 21 and 22 is controlled to an appropriate value such that output matching circuit 12 can attain matching over a wide band from 4.8 to 6.0 GHz.

Figure 2:
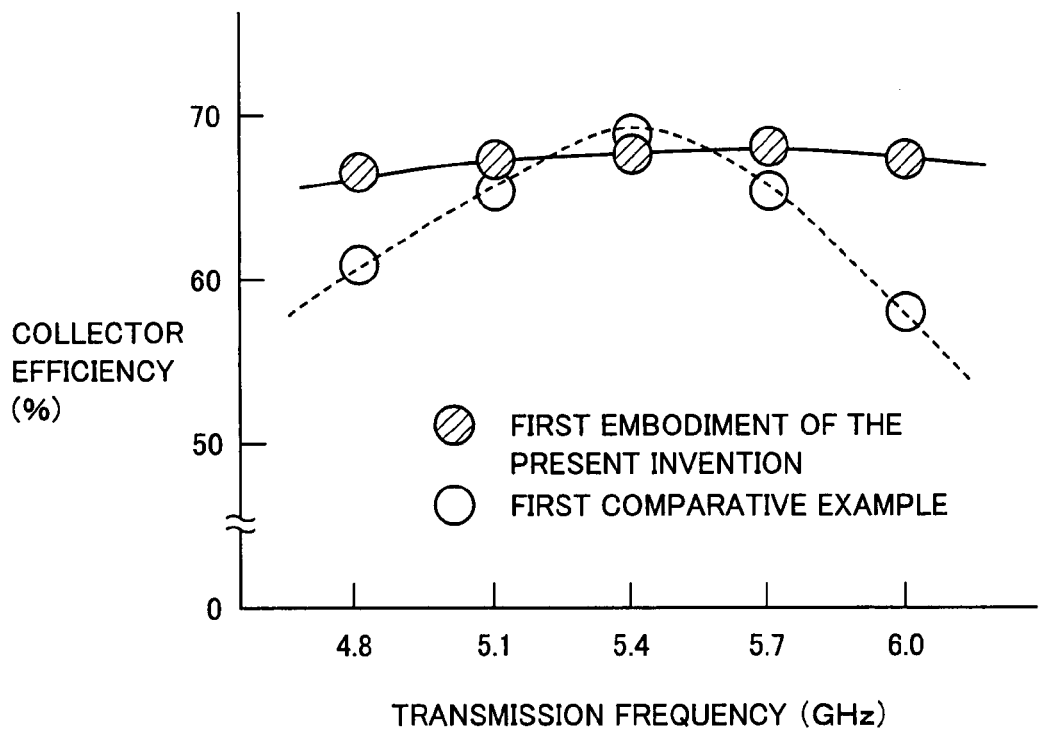
FIG. 2 illustrates comparison between the power amplifier according to the first embodiment of the present invention and a power amplifier according to a first conventional example shown as a first comparative example in FIG. 7.
Figure 7:
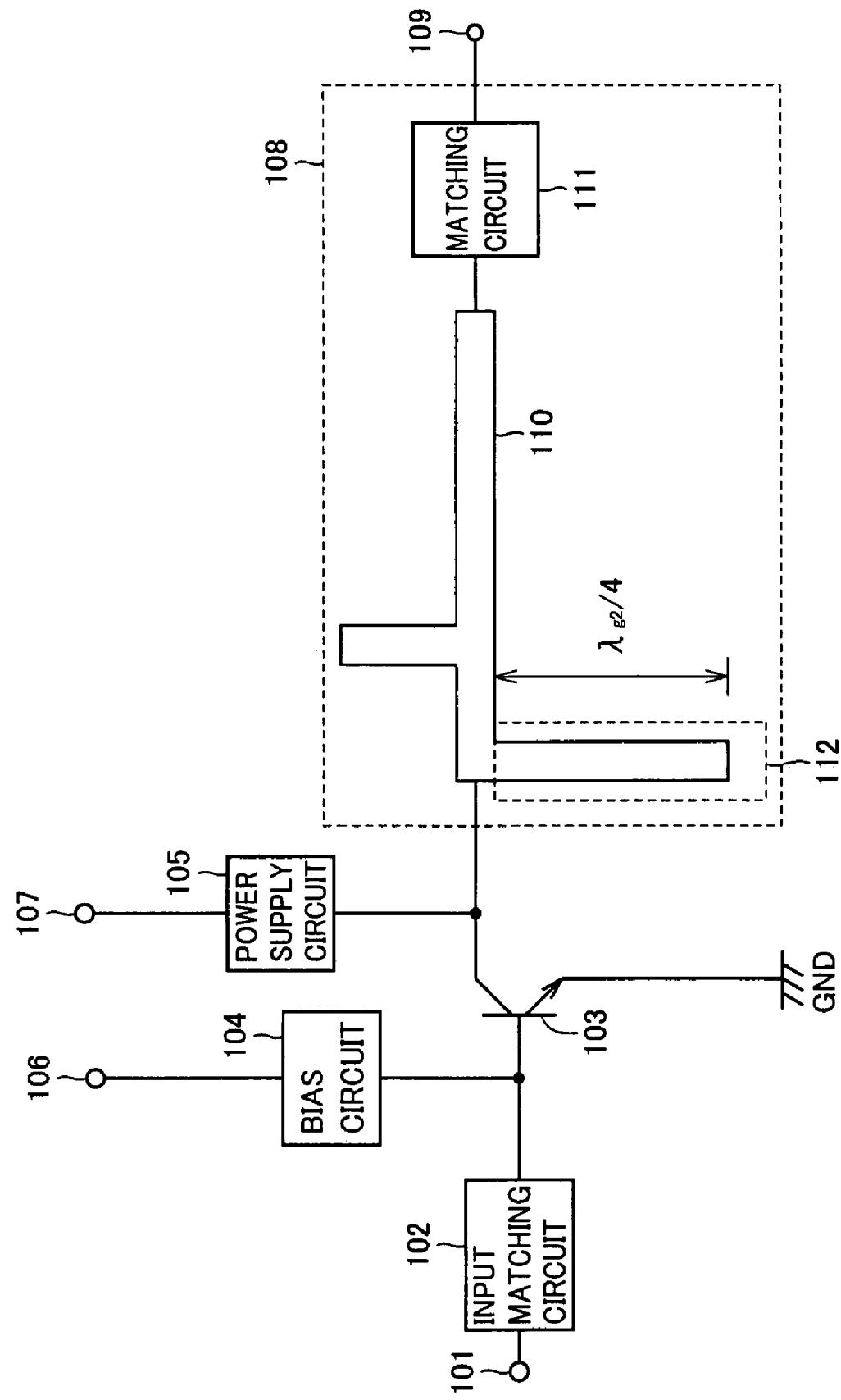
FIG. 7 illustrates an exemplary conventional power amplifier.

Comparison between the power amplifier according to the first embodiment of the present invention and the power amplifier according to the first conventional example shown as the first comparative example in FIG. 7 will be described with reference to FIG. 2.

Here, results based on comparison of variations, depending on the transmission frequency, in the collector efficiency measured when an output is such that back-off from saturation power attains to 1 dB are shown. It is noted that circuit design is similar in both power amplifiers except for the output matching circuit. In addition, the open stub in the first comparative example is set to have a length of λ/4 with respect to the frequency twice as high as 5.4 GHz which is the central frequency of the transmission frequency band.

As shown here, the collector efficiency of the power amplifier according to the first embodiment of the present invention is high across a wide frequency range from 4.8 to 6.0 GHz. In contrast, though the power amplifier according to the first comparative example attains collector efficiency higher than in the present embodiment when the frequency is set to 5.4 GHz, the power amplifier according to the first comparative example attains collector efficiency lower than the power amplifier according to the first embodiment of the present invention in other frequency bands.

Figure 3:
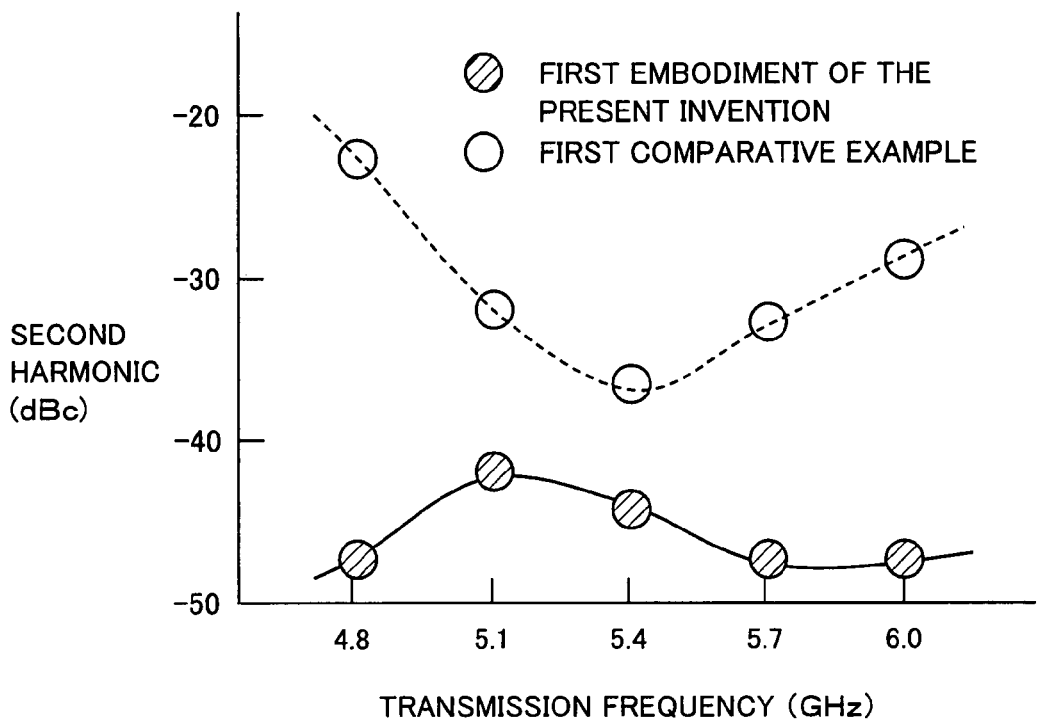
FIG. 3 illustrates another comparison between the power amplifier according to the first embodiment of the present invention and the power amplifier shown as the first comparative example.

Another comparison between the power amplifier according to the first embodiment of the present invention and the power amplifier shown as the first comparative example will be described with reference to FIG. 3.

Here, results based on comparison of variations, depending on the transmission frequency, in the second harmonic generated from the output terminal, when an output is such that back-off from saturation power attains to 1 dB are shown. In the power amplifier according to the first embodiment of the present invention, the second harmonic is suppressed across a wide frequency range from 4.8 to 6.0 GHz. In contrast, in the power amplifier according to the first comparative example, the second harmonic is suppressed only when the frequency is set to 5.4 GHz, and suppression is less in other frequency bands.

In summary, according to the power amplifier of the first embodiment of the present invention, two trap circuits different in frequencies at which short-circuit is established are provided. Out of the two trap circuits, the trap circuit higher in frequency at which short-circuit is established is arranged closer to the power amplification element, so as to trap the frequency band higher than the frequency twice as high as the central frequency of the transmission frequency band and to substantially short-circuit the impedance of the output matching circuit with respect to the frequency in the frequency band twice as high as the transmission frequency band on the side of the output end of the power amplification element. In addition, the trap circuit lower in frequency at which short-circuit is established is arranged farther from the power amplification element, so as to trap the frequency band lower than the frequency twice as high as the central frequency in the transmission frequency band. Thus, a power amplifier capable of suppressing radiation of the second harmonic over a wide frequency band and operating with high efficiency over a wide band can be provided.

Second Embodiment

Figure 4:
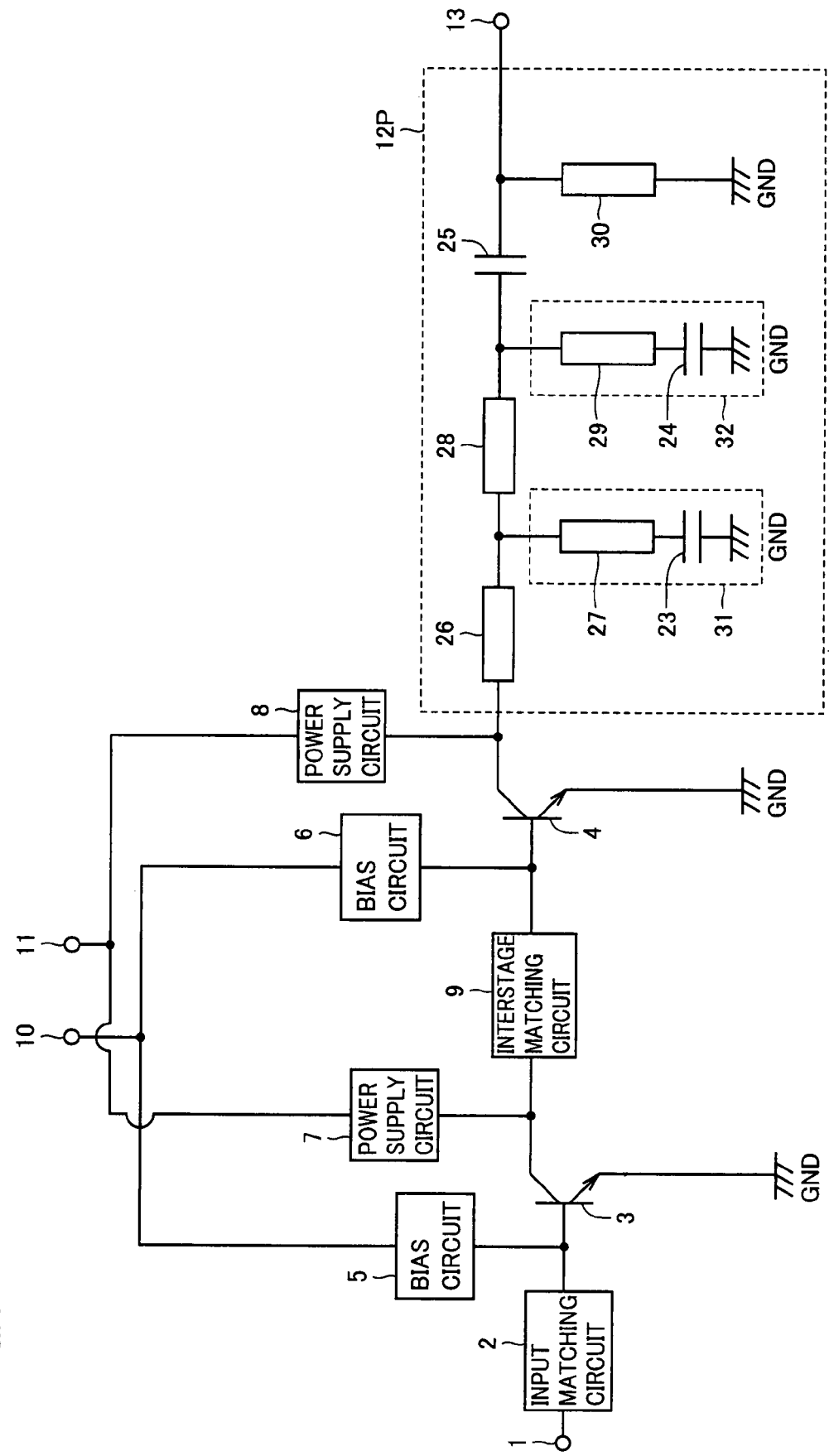
FIG. 4 illustrates a power amplifier according to a second embodiment of the present invention.

A power amplifier according to a second embodiment of the present invention will be described with reference to FIG. 4.

The power amplifier according to the second embodiment of the present invention is different from the power amplifier according to the first embodiment in that output matching circuit 12 is replaced with an output matching circuit 12P.

Output matching circuit 12P includes capacitors (C) 23 to 25 and inductors (L) 26 to 30. In the present embodiment, a configuration of the power amplifier using two power amplification element stages and adapted to a wide band, i.e., a transmission frequency band from 3.1 to 3.9 GHz, will be described.

The power amplifier is formed on a GaAs semiconductor substrate, and the power amplification elements are implemented by GaAs hetero-junction bipolar transistors. Capacitors 23 to 25 are implemented by MIM (Metal-Insulator-Metal) capacitors formed on the GaAs semiconductor substrate. Meanwhile, inductors 26 to 30 in output matching circuit 12P are implemented by microstrip lines and spiral inductors formed on the GaAs semiconductor substrate.

The configuration of output matching circuit 12P will now be described. Power amplification element 4 has the collector coupled to output matching circuit 12P. Inductor 26 has one terminal coupled to the collector of power amplification element 4 and the other terminal coupled to one terminal of inductor 28. In addition, the other terminal of inductor 28 is coupled to one electrode of capacitor 25. The other electrode of capacitor 25 is coupled to output terminal 13.

A series resonant circuit consisting of capacitor 23 and inductor 27 is coupled to ground GND and the other terminal of inductor 26, thus serving as a trap circuit 31. In addition, a series resonant circuit consisting of capacitor 24 and inductor 29 is coupled to ground GND and the other terminal of inductor 28, thus serving as a trap circuit 32.

As described above, trap circuits 31 and 32 are implemented in such a manner that the series resonant circuits including a set of capacitor 23 and inductor 27 and a set of capacitor 24 and inductor 29 are connected to the grounds, respectively, and thus the trap circuits are made smaller in size.

A resonant frequency of trap circuit 31 arranged closer to the power amplification element is set to 10.6 GHz such that trap circuit 31 serves as the trap circuit trapping a frequency up to the frequency band higher than the frequency three times as high as the central frequency of the transmission frequency band. In addition, the value of inductor 26 is set so as to set the resonant frequency of the series resonant circuit including inductors 26 and 27 and capacitor 23 to 7.4 GHz, such that trap circuit 31 substantially short-circuits the impedance of the output matching circuit with respect to the frequency in the frequency band twice as high as the transmission frequency band on the side of the output end of power amplification element 4.

On the other hand, the resonant frequency of trap circuit 32 arranged farther from the power amplification element is set to 6.0 GHz such that trap circuit 32 serves as the trap circuit trapping a frequency down to the frequency band lower than the frequency twice as high as the central frequency of the transmission frequency band. Taking into account the fact that these series resonant circuits serve as capacitive components with respect to the frequency in the transmission frequency band, each value of inductor 27 and capacitor 23 as well as inductor 29 and capacitor 24 in trap circuits 31 and 32, together with capacitor 25 and inductors 28 and 30, is controlled to an appropriate value such that output matching circuit 12P can attain matching over a wide band from 3.1 to 3.9 GHz.

Figure 5:
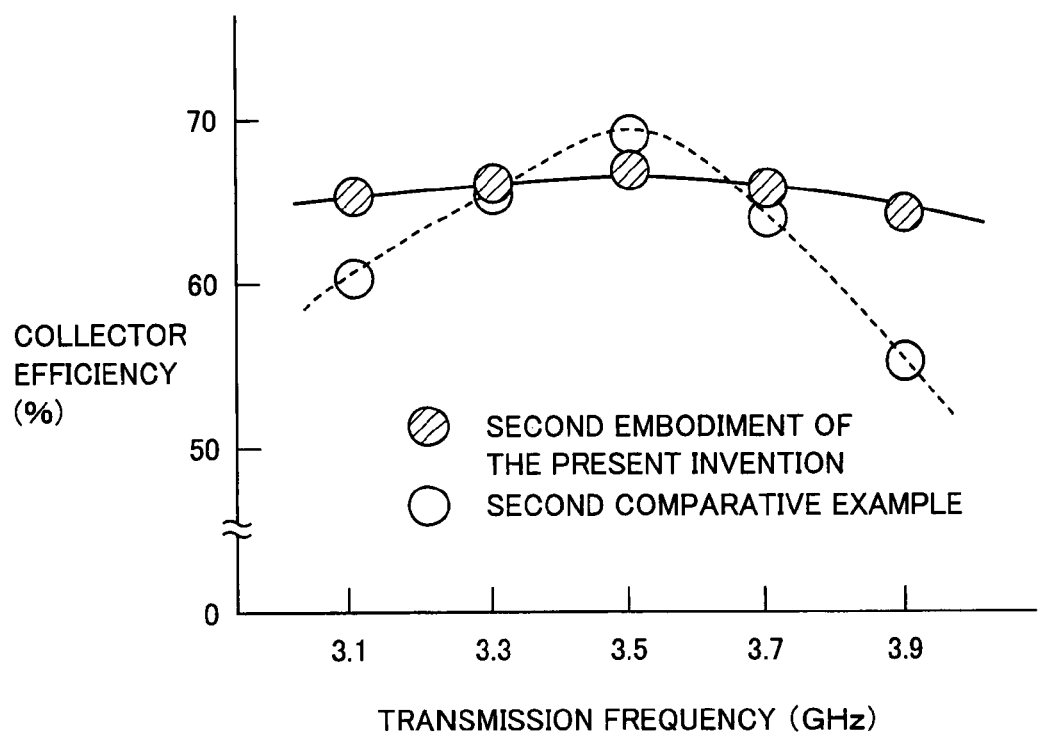
FIG. 5 illustrates comparison between the power amplifier according to the second embodiment of the present invention and a power amplifier according to a second conventional example shown as a second comparative example in FIG. 8.
Figure 8:
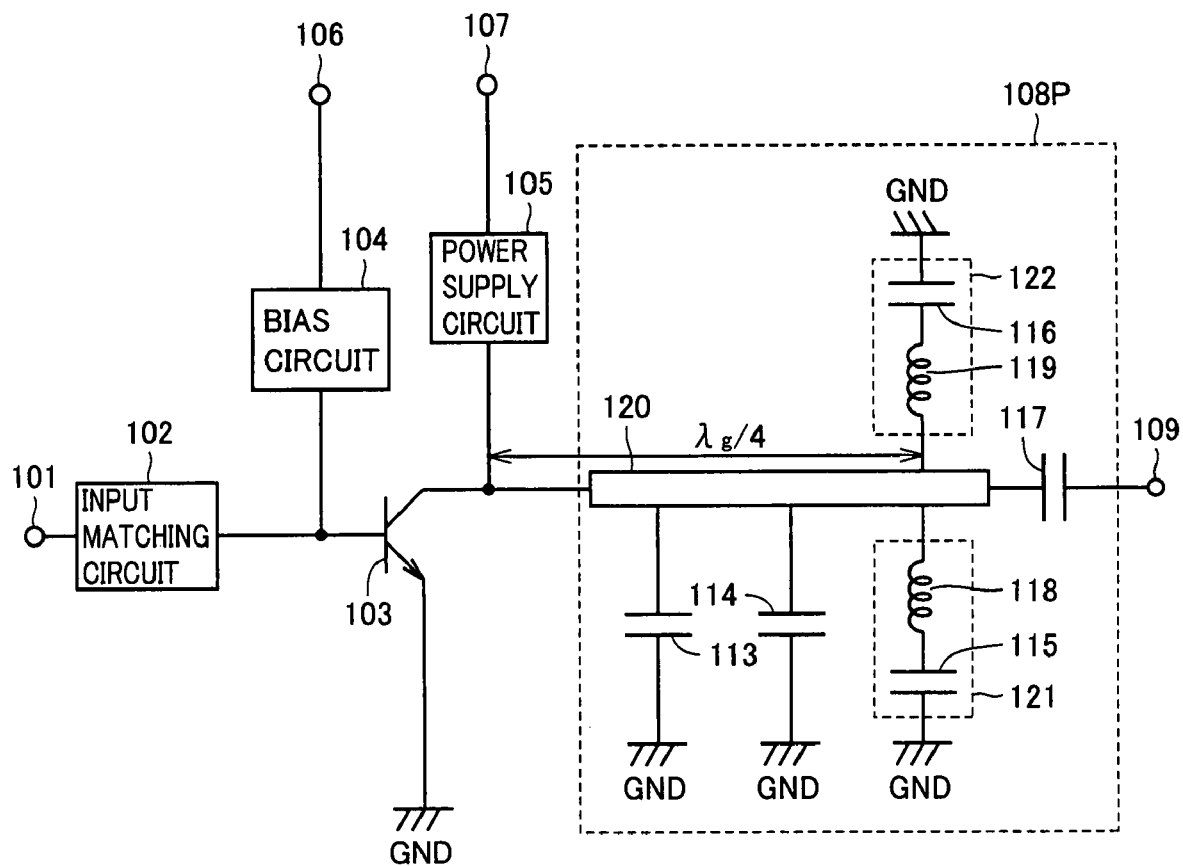
FIG. 8 illustrates another exemplary conventional power amplifier.

Comparison between the power amplifier according to the second embodiment of the present invention and a power amplifier according to the second conventional example shown as a second comparative example in FIG. 8 will be described with reference to FIG. 5.

Here, results based on comparison of variations, depending on the transmission frequency, in the collector efficiency measured when an output is such that back-off from saturation power attains to 1 dB are shown. It is noted that circuit design is similar in both power amplifiers except for the output matching circuit. In addition, the resonant frequencies of trap circuits 121 and 122 in the second comparative example are set to 7.0 GHz and 10.5 GHz respectively, which represent the frequencies twice and three times as high as 3.5 GHz which is the central frequency of the transmission frequency band, respectively.

The collector efficiency of the power amplifier according to the second embodiment of the present invention is high across a wide frequency range from 3.1 to 3.9 GHz. In contrast, though the power amplifier according to the second comparative example attains collector efficiency higher than in the present embodiment when the frequency is set to 3.5 GHz, the power amplifier according to the second comparative example attains collector efficiency lower than the power amplifier according to the second embodiment of the present invention in other frequency bands.

Another comparison between the power amplifier according to the second embodiment of the present invention and the power amplifier shown as the second comparative example will be described with reference to FIG. 6.

Figure 6:
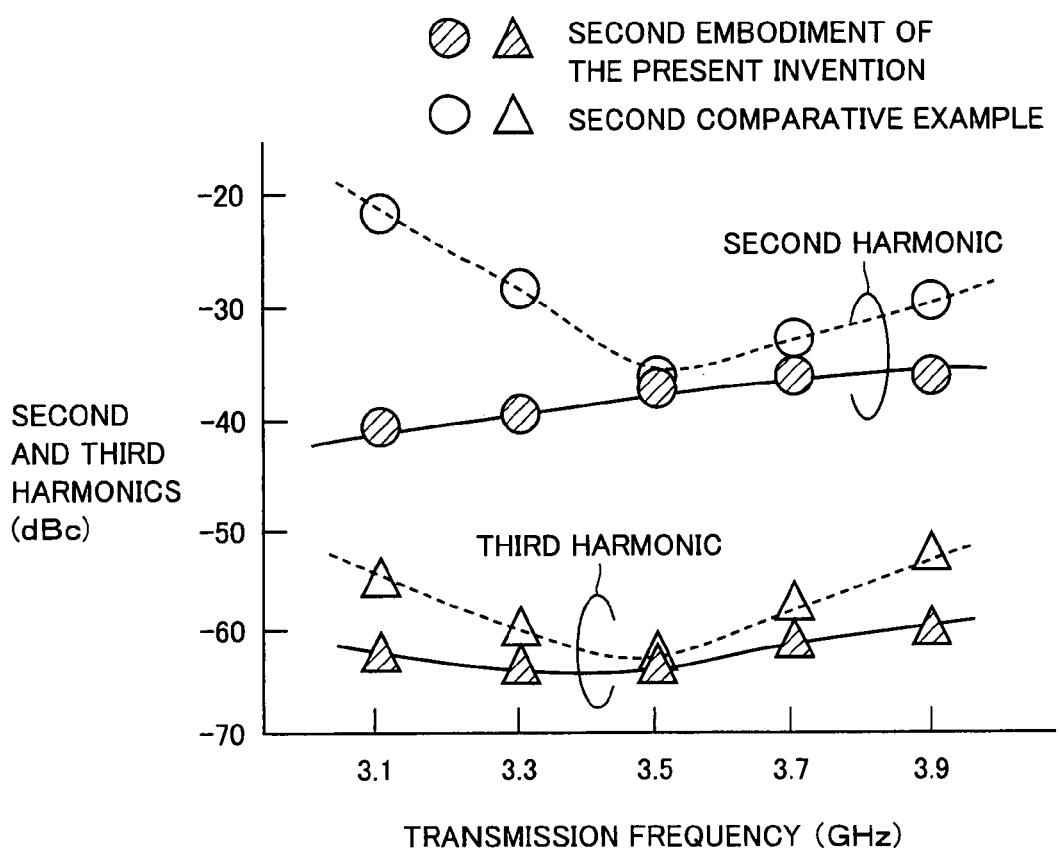
FIG. 6 illustrates another comparison between the power amplifier according to the second embodiment of the present invention and the power amplifier shown as the second comparative example.

As shown in FIG. 6, here, results based on comparison of variations, depending on the transmission frequency, in the second harmonic and the third harmonic generated from the output terminal, when an output is such that back-off from saturation power attains to 1 dB in the power amplifier according to the second embodiment and the power amplifier according to the second comparative example, are shown. In the power amplifier according to the present embodiment, the second harmonic and the third harmonic are suppressed across a wide frequency range from 3.1 to 3.9 GHz. In contrast, in the power amplifier according to the second comparative example, the second harmonic and the third harmonic are suppressed only when the frequency is set to 3.5 GHz, and suppression is less in other frequency bands.

As described above, according to the power amplifier of the second embodiment of the present invention, two trap circuits different in frequencies at which short-circuit is established are provided. Out of the two trap circuits, the trap circuit higher in frequency at which short-circuit is established is arranged closer to the power amplification element. The trap circuit is arranged closer to the power amplification element, with the inductor being interposed, so as to trap the frequency band higher than the frequency three times as high as the central frequency of the transmission frequency band, and to substantially short-circuit the impedance of the output matching circuit with respect to the frequency in the frequency band twice as high as the transmission frequency band on the side of the output end of the power amplification element.

In addition, the trap circuit lower in frequency at which short-circuit is established is arranged farther from the power amplification element, so as to trap the frequency band lower than the frequency twice as high as the central frequency in the transmission frequency band.

Thus, a power amplifier capable of suppressing radiation of the second harmonic and the third harmonic over a wide frequency band and operating with high efficiency over a wide band can be provided.

The present invention has specifically been described above with reference to the embodiments. The present invention, however, is not limited to those embodiments above, and the present invention is susceptible to various modifications without departing from the gist of the present invention.

For example, GaAs hetero-junction bipolar transistors (HBTs) have been used as exemplary power amplification elements in the embodiment above, however, other bipolar transistors such as Si bipolar transistors, SiGe HBTs, InP HBTs, and the like may also be employed. In addition, though bipolar transistors have been used as power amplification elements in the embodiment above, field-effect transistors may also naturally be employed as the power amplification elements.

Moreover, in the embodiment above, the power amplifier has a multi-stage configuration using two power amplification element stages, however, a single-stage configuration or a multi-stage configuration including three or more power amplification element stages may also similarly be employed.

Further, in the embodiment above, MIM capacitors, microstrip lines and spiral inductors formed on the semiconductor substrate have been employed as capacitors and inductors, however, capacitors and inductors not formed on the semiconductor substrate, such as capacitors implemented by chip parts or inductors implemented by bonding wires, may also naturally be employed.

In addition, in the embodiment above, a series resonant circuit in which a capacitor and an inductor are connected in series has been employed as a trap circuit, however, a trap circuit implemented by an open stub, a resonant circuit in another form, or the like may also similarly be employed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A power amplifier comprising:
 a power amplification element; and
 an output matching circuit connected to an output end of said power amplification element; wherein
 said output matching circuit includes a plurality of trap circuits establishing short-circuit at frequencies higher than a desired transmission frequency band and at frequencies different from each other,
 out of at least two trap circuits among said plurality of trap circuits, the trap circuit higher in frequency at which short-circuit is established is arranged closer to the output end of said power amplification element than the trap circuit lower in frequency at which short-circuit is established,
 the trap circuit arranged closer to the output end of said power amplification element is set such that a frequency at which short-circuit is established is more than twice as high as a central frequency of said desired transmission frequency band and impedance of said output matching circuit on a side of the output end of said power amplification element is substantially short-circuited with respect to at least one frequency in a frequency band twice as high as said desired transmission frequency band, and
 the trap circuit lowest in frequency at which short-circuit is established among said trap circuits is set such that a frequency at which short-circuit is established is at least 1.4 times as high as a frequency highest in said desired transmission frequency band and less than twice as high as the central frequency of said desired transmission frequency band.

2. The power amplifier according to claim 1, wherein the trap circuit arranged closer to the output end of said power amplification element is arranged closest to the output end of said power amplification element.

3. The power amplifier according to claim 1, wherein the frequency at which the trap circuit establishes short-circuit, the trap circuit being arranged closer to the output end of said power amplification element, is set to a frequency in a frequency band three times as high as said desired transmission frequency band.

4. The power amplifier according to claim 1, wherein said trap circuit is implemented by a series resonant circuit including at least an inductor and a capacitor.

* * * * *